United States Patent
Seler et al.

(10) Patent No.: US 9,230,926 B2
(45) Date of Patent: Jan. 5, 2016

(54) FUNCTIONALISED REDISTRIBUTION LAYER

(71) Applicant: Infineon Technologies AG, Neubiberg (DE)

(72) Inventors: Ernst Seler, Munich (DE); Maciej Wojnowski, Munich (DE)

(73) Assignee: Infineon Technologies AG, Neubiberg (DE)

( * ) Notice: Subject to any disclaimer, the term of this patent is extended or adjusted under 35 U.S.C. 154(b) by 168 days.

(21) Appl. No.: 14/016,045

(22) Filed: Aug. 31, 2013

(65) Prior Publication Data

US 2015/0061091 A1 Mar. 5, 2015

(51) Int. Cl.
*H01L 23/48* (2006.01)
*H01L 23/66* (2006.01)
*H01L 21/768* (2006.01)
*H01L 23/00* (2006.01)
*H01L 21/56* (2006.01)

(52) U.S. Cl.
CPC .......... *H01L 23/66* (2013.01); *H01L 21/76838* (2013.01); *H01L 24/19* (2013.01); *H01L 24/85* (2013.01); *H01L 24/96* (2013.01); *H01L 21/568* (2013.01); *H01L 2224/12105* (2013.01); *H01L 2224/24137* (2013.01); *H01L 2224/85* (2013.01)

(58) Field of Classification Search
CPC ................. H01L 23/49816; H01L 2224/4845; H01L 2224/48464
USPC ......................................... 257/664, 738, 780
See application file for complete search history.

(56) References Cited

PUBLICATIONS

Sean Fikar et al. "A 100GHz Bandwidth Matched Chip to PCB Tansition Using Bond Wires for Broadband Matching" IEEE Workshop on Signal Propagation on Interconnects—SPI , 2008.
E. Seler et al., "Comparative Analysis of High-Frequency Trasitions in Embedded Wafer Level BGA (eWLB) and Quad Flat no Leads (VQFN) Packages," IEEE 14th Electronics Packaging Technology Conference, Dec. 2012.

*Primary Examiner* — Elias M Ullah

(57) ABSTRACT

An electronic device which comprises at least one interconnect, a semiconductor chip comprising at least one electric chip pad, an encapsulant structure packaging at least a part of the semiconductor chip, and an electrically conductive redistribution layer arranged between and electrically coupled with the at least one interconnect and the at least one chip pad, wherein the redistribution layer comprises at least one adjustment structure configured for adjusting radio frequency properties of a transition between the semiconductor chip and its periphery.

20 Claims, 9 Drawing Sheets

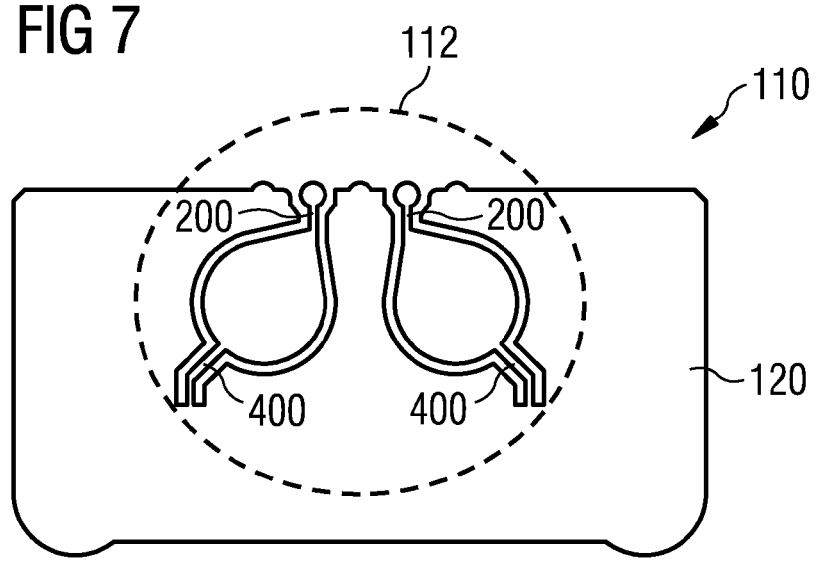
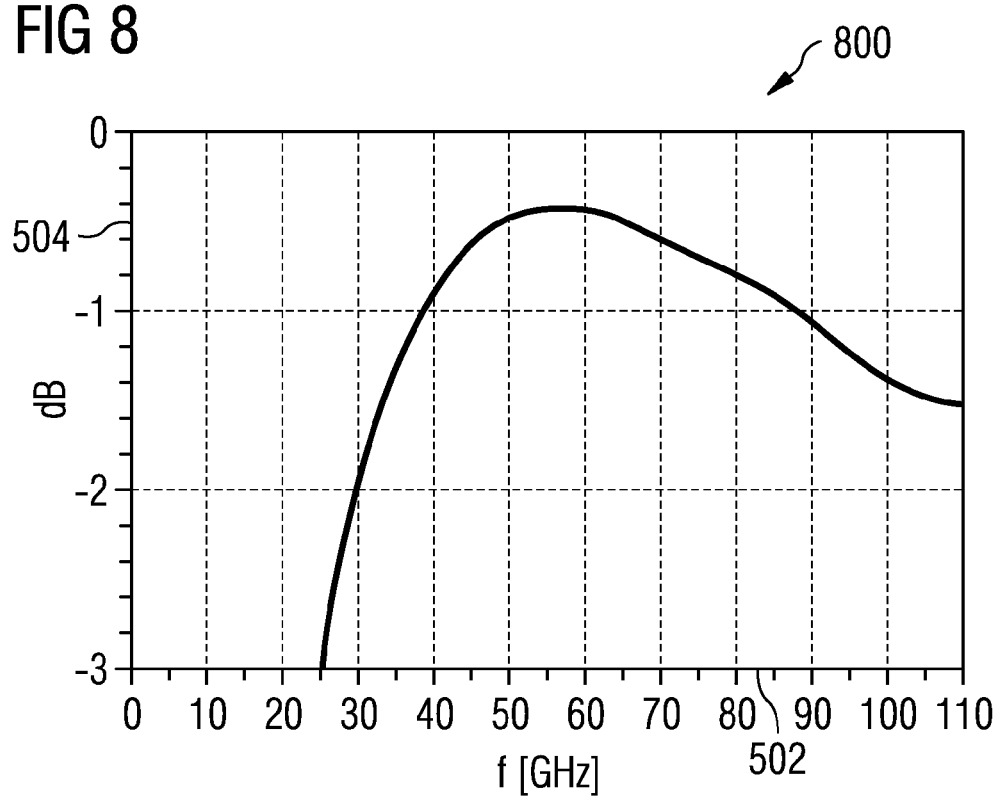

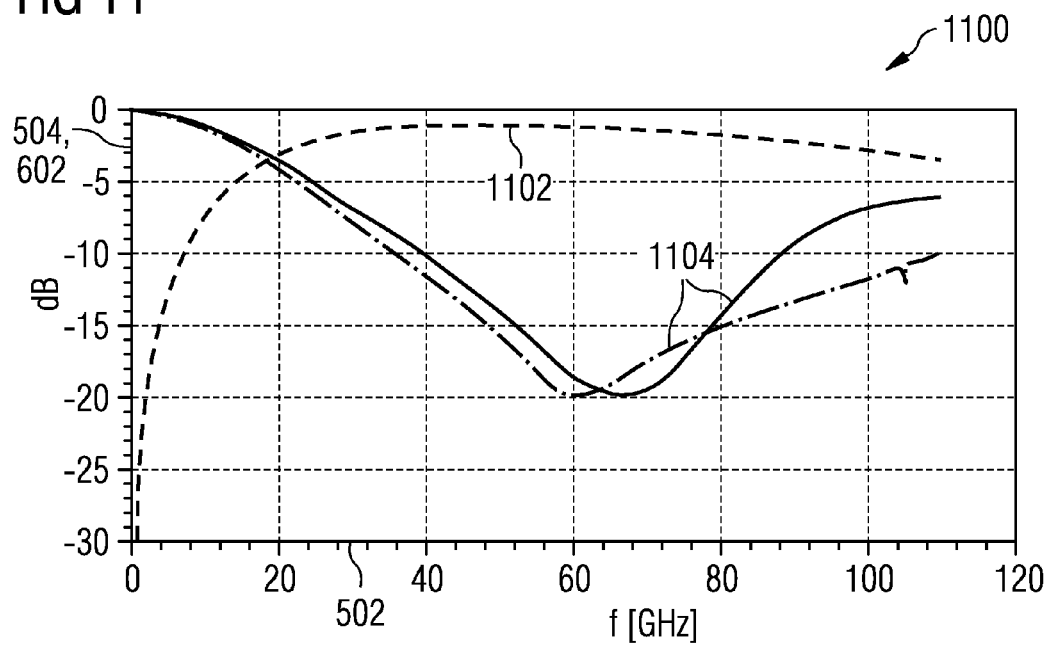
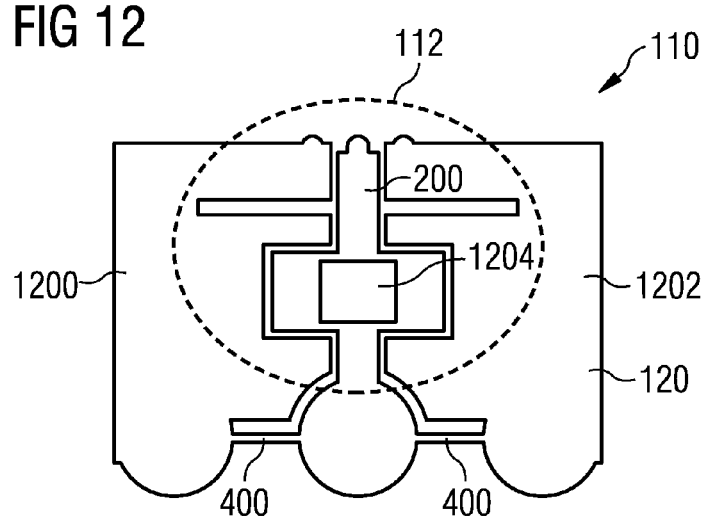

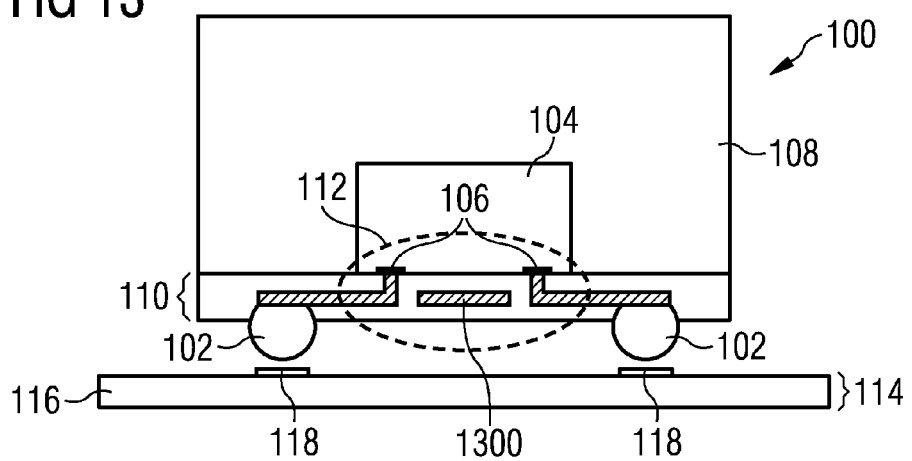
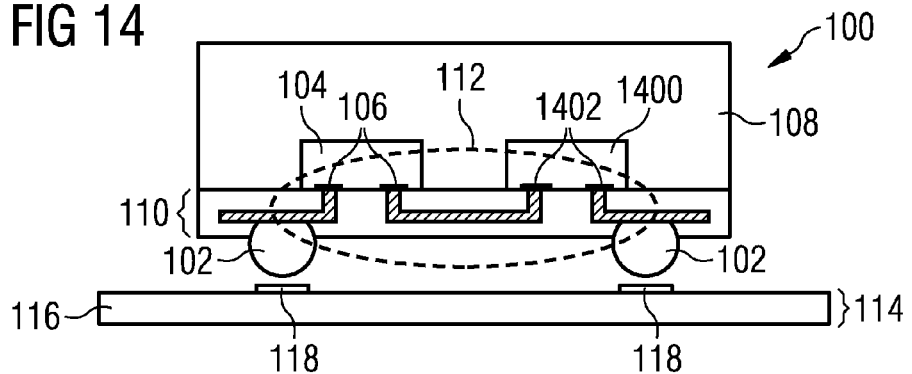
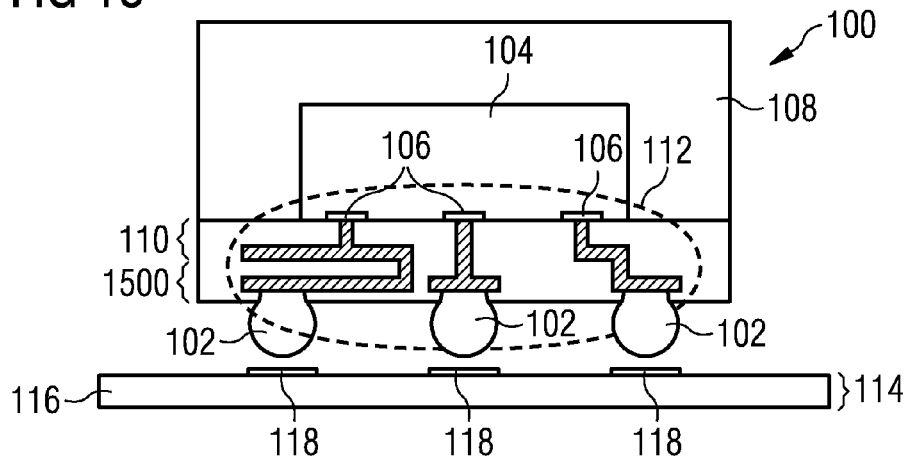

FUNCTIONALISED REDISTRIBUTION LAYER

BACKGROUND OF THE INVENTION

1. Field of the Invention

The present invention relates to electronic devices, and methods of manufacturing electronic arrangements and electronic devices.

2. Description of the Related Art

Embedded Wafer Level Ball Grid Array (eWLB) technology allows the realization of semiconductor devices with a high number of interconnects. The package is not realized on a silicon wafer as for classical Wafer Level Package, but on an artificial wafer. For this purpose, a front-end-processed wafer is diced and the singularized semiconductor chips are placed on a carrier. The distance between the semiconductor chips is typically larger than on the silicon wafer. The gaps and the edges around the semiconductor chips are filled with an embedding structure to form the artificial wafer. After curing, the artificial wafer containing an encapsulant frame around the semiconductor chips for carrying additional interconnect elements is realized. After the built of the artificial wafer, electrical connections from the chip pads to the interconnects are realized by a redistribution layer in thin-film technology.

SUMMARY OF THE INVENTION

There may be a need to provide packaged semiconductor chips being combinable with an application-specific mounting substrate without undesired electronic artefacts.

According to an exemplary embodiment, an electronic device is provided which comprises at least one interconnect, a semiconductor chip comprising at least one electric chip pad, an encapsulant structure packaging at least a part of the semiconductor chip, and an electrically conductive redistribution layer arranged between and electrically coupled with the at least one interconnect and the at least one chip pad, wherein the redistribution layer comprises at least one adjustment structure configured for adjusting radio frequency properties of a transition between the semiconductor chip and its periphery.

According to another exemplary embodiment, a method of manufacturing an electronic arrangement is provided, wherein the method comprises providing a plurality of singularized semiconductor chips each comprising at least one electric chip pad, packaging each of the plurality of semiconductor chips at least partially by a common encapsulant structure, forming an electrically conductive redistribution layer electrically coupled with the chip pads, integrating at least one adjustment structure within the redistribution layer, configuring the at least one adjustment structure for adjusting radio frequency properties of a transition between at least one of the semiconductor chips and a periphery thereof, and forming an array of interconnects electrically connected with the redistribution layer.

According to yet another exemplary embodiment, an electronic device is provided which comprises at least one interconnect, a semiconductor chip comprising at least one electric chip pad, an encapsulant structure packaging at least a part of the semiconductor chip, and an electrically conductive redistribution layer arranged between and electrically coupled with the at least one interconnect and the at least one chip pad, wherein the redistribution layer comprises at least one electrostatic discharge protection structure configured for protecting the electronic device against electrostatic discharge.

According to yet another exemplary embodiment, a method of manufacturing an electronic arrangement is provided, wherein the method comprises providing a plurality of singularized semiconductor chips each comprising at least one electric chip pad, packaging each of the plurality of semiconductor chips at least partially by a common encapsulant structure, forming an electrically conductive redistribution layer electrically coupled with the chip pads, integrating at least one electrostatic discharge protection structure within the redistribution layer, configuring the at least one electrostatic discharge protection structure for protecting at least a part of the semiconductor chips against electrostatic discharge, and forming an array of interconnects electrically connected with the redistribution layer.

An exemplary embodiment has the advantage that a specific design of a redistribution layer sandwiched between packaged semiconductor chips and interconnects for an electric coupling to a mounting substrate functionalizes the redistribution layer so as to efficiently suppress electronic artefacts which may occur in the system formed by the semiconductor chips and their electronic periphery. According to one aspect, this can be achieved by forming an adjustment structure as part of the redistribution layer which adjusts radio frequency properties of a transition between semiconductor chip and its electronic periphery to suppress such artefacts or to set a desired radio frequency behaviour. According to another aspect, this can be achieved by integrating an electrostatic discharge protection structure in the redistribution layer to thereby suppress electronic artefacts and damages resulting from electrostatic discharge effects.

DESCRIPTION OF FURTHER EXEMPLARY EMBODIMENTS

In the context of the present application, the term "adjustment structure" may particularly denote a physical, electrically conductive portion of the redistribution layer which is shaped and dimensioned so as to characteristically influence the radio frequency properties of the transition so as to obtain a desired electronic characteristic at this transition, particularly a defined target behaviour.

In the context of the present application, the term "radio frequency properties" may particularly denote a behaviour of electric signals propagating between the semiconductor chip and the one or more interconnects via the redistribution layer in the radio frequency regime, in particular above 1 GHz or even above 10 GHz. With the advent of continuously increasing radio frequency values, electric path lengths at the transition may become comparable with or even electrically long with regard to the wavelengths of the traveling signals so that undesired interference effects and the like may occur. For instance, the impedance (depending on a ratio of inductance and capacitance, i.e. L/C) at such a transition may become unmatched and may deviate from reference values, signal reflection effects may occur and the risk of signal losses increases. These and other effects may define the radio frequency properties. Radio frequency waves may be waves with a wavelength in an order of magnitude of millimetres.

In the context of the present application, the term "transition" may particularly denote a physical and electrical boundary between semiconductor chip pads and electrically connected periphery structures. Such a transition may relate to a transition between semiconductor chip and mounting substrate (such as a printed circuit board, PCB), semiconductor chip and a further semiconductor chip of the same electronic device, semiconductor chip and another passive component integrated in the redistribution layer (for instance an antenna), etc.

In the context of the present application, the term "periphery" may particularly denote an electronic circuit component peripherally coupled electrically with the semiconductor chip. Examples for such an electronic periphery are a mounting substrate, a further semiconductor chip, and another passive component integrated in the redistribution layer, etc.

In the context of the present application, the term "electrostatic discharge protection structure" may particularly denote a physical, electrically conductive portion of the redistribution layer which is shaped and dimensioned to provide for a protection of the semiconductor chip against electrostatic discharge. Such an electrostatic discharge protection structure may be coupled to signal lines along which a radio frequency signal propagates between chip pads and interconnects. Electrostatic discharge (ESD) may particularly denote a sudden flow of electricity between two objects caused by contact, an electrical short, or dielectric breakdown. ESD can cause a range of harmful effects, including failure of solid state electronics components such as integrated circuits which can suffer permanent damage when subjected to high voltages.

In the following, further exemplary embodiments of the electronic devices and the methods will be explained.

A gist of an exemplary embodiment can be seen in that a redistribution layer is designed (optionally in combination with a corresponding interconnect design) so that a desired radio frequency behaviour is achievable at a transition between the semiconductor chip and its electronic periphery. In particular, a functionalised redistribution layer of an embedded package may be provided. The redistribution layer provides a high degree of freedom for a circuit designer to provide adjustment structures (such as compensation and/or filter structures) to meet specific requirements (such as impedance matching at one or more of the transitions) of a radio frequency application. By performing this radio frequency adaptation on redistribution layer level, there remains no need for a customer to perform a corresponding radio frequency adjustment at a substrate (such as a printed circuit board) on which the packaged semiconductor chip is to be mounted by the customer. In other words, the adjustment of the redistribution layer allows to provide a packaged semiconductor chip which can be used universally, regardless of the configuration of the substrate to be connected. The customer simply needs to connect this substrate to the interconnect of the semiconductor chip package in form of the electronic device and does not have to care about impedance matching and the like. Advantageously, a short circuit line or the like may be integrated in the redistribution layer for electrostatic discharge suppression purposes.

In an embodiment, the encapsulant structure may be a molding structure. Correspondingly, the process of encapsulating may be a process of molding.

In an embodiment, the encapsulant structure may be a laminate. Correspondingly, the process of encapsulating may be a process of laminating.

In an embodiment, the at least one adjustment structure is configured for matching impedance of the transition. for example, the impedance of the transition may be adjusted to assume a target value, for instance 50 Ω.

In an embodiment, the at least one adjustment structure is configured for loss reduction at the transition. At the transition, reflection of a part of the signal energy can occur particularly when the dimension of the transition is in the same order of magnitude as the wavelength of the traveling radio frequency signal. By adjusting shape and dimension of the electrically conductive structures in the redistribution layer, such reflections can be reduced to thereby decrease losses.

In an embodiment, the at least one adjustment structure is configured as a frequency filter at the transition. Adjusting shape and dimension of the redistribution layer allows to render the structure transparent for signals at certain frequencies, and basically intransparent for signals at other frequencies. Therefore, a frequency filter may be integrated in the redistribution layer as well.

In an embodiment, the electronic device comprises a substrate which comprises an electrically insulating carrier and a wiring structure on and/or in the carrier, wherein the wiring structure is electrically coupled to the at least one interconnect, wherein the at least one adjustment structure is configured for adjusting radio frequency properties of a transition between the semiconductor chip and the substrate. Such a substrate may be a printed circuit board (PCB), a ceramic board, a flex board or the like on which the packaged semiconductor chip is to be mounted.

In an embodiment, the electronic device comprises at least one further semiconductor chip comprising at least one further electric chip pad, wherein the encapsulant structure packages additionally at least a part of the further semiconductor chip, and wherein the redistribution layer is electrically coupled additionally with the at least one further chip pad, wherein the at least one adjustment structure is configured for adjusting radio frequency properties of a transition between the semiconductor chip and the at least one further semiconductor chip. Therefore, the radio frequency adjustment may be performed in the redistribution layer connecting two (or more) semiconductor chips packaged within the same electronic device.

In an embodiment, the electronic device comprises an antenna, in particular integrated in the redistribution layer, wherein the at least one adjustment structure is configured for adjusting radio frequency properties of a transition between the semiconductor chip and the antenna. Therefore, the radio frequency adjustment may be performed in the redistribution layer at a transition connecting the semiconductor chip to one or more passive structures (such as capacitances, inductors, etc.) forming an antenna integrated within the redistribution layer).

In an embodiment, the adjustment structure is selected from a group consisting of a short-circuited stub, an open-circuited stub, a short high-impedance line, a short low impedance line, a slot line, a wave structure, a low pass filter, a high pass filter, and a bandpass filter.

In an embodiment, the at least one adjustment structure comprises at least one radio frequency circuit component. Examples for such a radio frequency circuit components are inductors, capacitances, ohmic resistances, etc. which may be formed as part of the redistribution layer.

In an embodiment, the redistribution layer comprises at least one electrostatic discharge protection structure configured for protecting the electronic device against electrostatic discharge. Correspondingly, the method may comprise forming the redistribution layer with at least one electrostatic discharge protection structure for protecting the electronic arrangement against electrostatic discharge. Particularly, one and the same redistribution layer may be used for performing both, radio frequency adjustment and ESD protection. This results in a very compact electronic device.

In an embodiment, the at least one electrostatic discharge protection structure comprises a ground section which is radio frequency decoupled from at least one other section of the redistribution layer, which at least one other section provides an electric coupling between the at least one interconnect and the at least one electric chip pad. The ground section may be galvanically coupled to the at least one other section to thereby provide the electrostatic discharge protection. In other words, the electrostatic discharge protection structure may be formed by the grounded section in combination with a narrow bridge (for instance having a thickness in a range between 5 µm and 40 µm, in particular in a range between 10 µm and 30 µm, for instance 20 µm) mechanically connecting the grounded section with the signal-carrying connection section. In an embodiment, the ground section is galvanically weakly coupled to the at least one other section by a constricted stub section which electrically decouples the ground section from the at least one other section for signals at an operation frequency of the electronic device. Such a constricted stub section may be basically intransparent for radio frequency signals propagating along the redistribution layer.

In an embodiment, the redistribution layer comprises at least one connection section tapering along a respective path from a respective one of the at least one interconnect to a respective one of the at least one electric chip pad. In other words, the signal line may become continuously narrower from the interconnect to the chip pad. Such a tapering section may confine the electric field locally which can prevent a disturbing strong electric field from entering into the semiconductor chip.

In an embodiment, the semiconductor chip is configured for operating at a frequency of at least about 10 GHz, in particular in a frequency range between about 10 GHz and about 140 GHz. However, other exemplary embodiments may operate at another operation frequency.

In an embodiment, the electronic device comprises at least one further redistribution layer arranged between and electrically coupled with at least a part of the interconnects and at least a part of the chip pads. Therefore, it is possible to further refine the electrical performance of the redistribution layer by providing a plurality of redistribution layers which cooperate so as to adjust the radio frequency properties and/or to provide an efficient ESD protection.

In an embodiment, the redistribution layer comprises a patterned layer of electrically conductive material. This patterned layer of electrically conductive material may be embedded in an electrically insulating matrix. The at least one adjustment structure may form part of the patterned layer of electrically conductive material.

In an embodiment, the interconnects are solder balls. The interconnects may be directly attached to the redistribution layer.

In an embodiment, the semiconductor chip is configured for a radio frequency application. For instance, the radio frequency application is selected from a group consisting of an automotive radar distance measurement application, a mobile communication application, an industrial communication application, and a sensor application. However, other applications are possible as well.

In an embodiment, a first main surface of the redistribution layer is in direct contact with at least a part of the chip pads and an opposing second main surface of the redistribution layer is in direct contact with at least a part of the interconnects. Thus, two opposing main surfaces of the planar redistribution layer may contact, on one side, the contact pads of the semiconductor chip and, on the other side, the solder balls or other interconnects.

In an embodiment, the electronic device is configured as an embedded Wafer Level Ball Grid Array package (eWLB). Embedded Wafer Level Ball Grid array technology offers a particularly high degree of freedom of designing the redistribution layer. Therefore, eWLB is particularly appropriate for performing the radio frequency adjustment and/or ESD protection according to exemplary embodiments.

In an embodiment, the method comprises trimming the redistribution layer so as to create a target radio frequency behaviour and/or a target ESD protection of the electronic arrangement or part thereof. In this context, the term "trimming" means that a width, length, thickness and/or shape of sub-structures of the redistribution layer are intentionally adjusted so as to obtain desired properties in terms of radio frequency adjustment and/or ESD protection. The trimming may be performed based on theoretical models of the electronic behaviour of the specifically designed redistribution layer. Additionally or alternatively, the trimming may be performed using simulation software or the like so that, with a trial-and-error approach, the electronic properties of the redistribution layer can be adjusted in terms of trimming. Particularly, the trimming may comprise at least one of the group consisting of reducing radio frequency loss at at least one transition between a respective one of the semiconductor chips and its periphery, matching impedance at at least one transition between a respective one of the semiconductor chips and its periphery, adjusting frequency characteristics at at least one transition between a respective one of the semiconductor chips and its periphery, and providing protection against electrostatic discharge at at least one transition between a respective one of the semiconductor chips and its periphery.

In an embodiment, the method comprises separating (for instance singularizing by sawing, punching, etching, etc.) the electronic arrangement into a plurality of individual electronic devices each comprising at least one of the semiconductor chips with at least one corresponding electric chip pad or chip contact, a portion of the encapsulant structure packaging the at least one semiconductor chip at least partially, a portion of the redistribution layer and a part of the interconnects. Thus, both the encapsulating and the formation and design of the redistribution layer can be performed on wafer level, before separating the electronic arrangement into individual electronic devices. This approach results in a particularly cheap and easy manufacture of the electronic devices.

In an embodiment, the method comprises mounting at least one of the electronic devices onto a substrate which comprises an electrically insulating carrier and a wiring structure on and/or in the carrier, wherein the wiring structure is electrically coupled to at least one of the interconnects assigned to the at least one electronic device. Hence, after singularising, the packaged electronic chips with integrated radio frequency adjustment and/or ESD protection can be placed and mounted on substantially any kind of substrate, since the matching of the transition between the semiconductor chip and its periphery has already been performed when manufacturing the electronic devices.

In one embodiment, the mounting is performed regardless of the electronic properties of the substrate and without additionally adjusting radio frequency properties of a transition between at least one of the semiconductor chips and the substrate. Therefore, the manufactured electronic devices can be considered as all-purpose devices which can be combined with basically any type of substrate without the need to perform a substrate-specific or application-specific adaptation of the radio frequency properties of the combined system.

Exemplary embodiments can be partly or entirely embodied or supported by one or more suitable software programs, which can be stored on or otherwise provided by any kind of data carrier, and which might be executed in or by any suitable data processing unit. Technical functions according to exemplary embodiments can be realized by a computer program, i.e. by software, or by using one or more special electronic optimization circuits, i.e. in hardware, or in hybrid form, i.e. by means of software components and hardware components. Such software may be implemented for designing the redistribution layer in terms of radio frequency adjustment and/or ESD protection. Such a software may carry out numerical simulation and optimization procedures based on predefined physical models, and/or may consider theoretical models concerning radio frequency behaviour and/or ESD during the design.

The above and other objects, features and advantages of the present invention will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments of the invention and constitute a part of the specification, illustrate exemplary embodiments of the invention.

In the drawings:

FIG. 7 shows a plan view of a redistribution layer of an electronic device according to another exemplary embodiment with a bandpass at about 60 GHz, a differential signal architecture, and an ESD protection.

FIG. 8 shows a diagram illustrating insertion loss in dependence of an operation frequency for the electronic device according to FIG. 7.

FIG. 11 shows a diagram illustrating insertion loss and return loss in dependence of an operation frequency for the electronic device according to FIG. 10.

FIG. 12 shows a plan view of a redistribution layer of an electronic device according to another exemplary embodiment with a bandpass, a single-ended signal architecture, and an ESD protection.

FIG. 13 shows a cross-sectional view of an electronic device according to another exemplary embodiment with a radio frequency adjustment, formed within a redistribution layer, between a semiconductor chip and an antenna integrated in the redistribution layer.

FIG. 14 shows a cross-sectional view of an electronic device according to another exemplary embodiment with a radio frequency adjustment, formed within a redistribution layer, between two semiconductor chips packaged within the same encapsulating structure.

FIG. 15 shows a cross-sectional view of an electronic device according to an exemplary embodiment with a radio frequency adjustment formed within two redistribution layers.

DETAILED DESCRIPTION OF EXEMPLARY EMBODIMENTS

Figure 1:
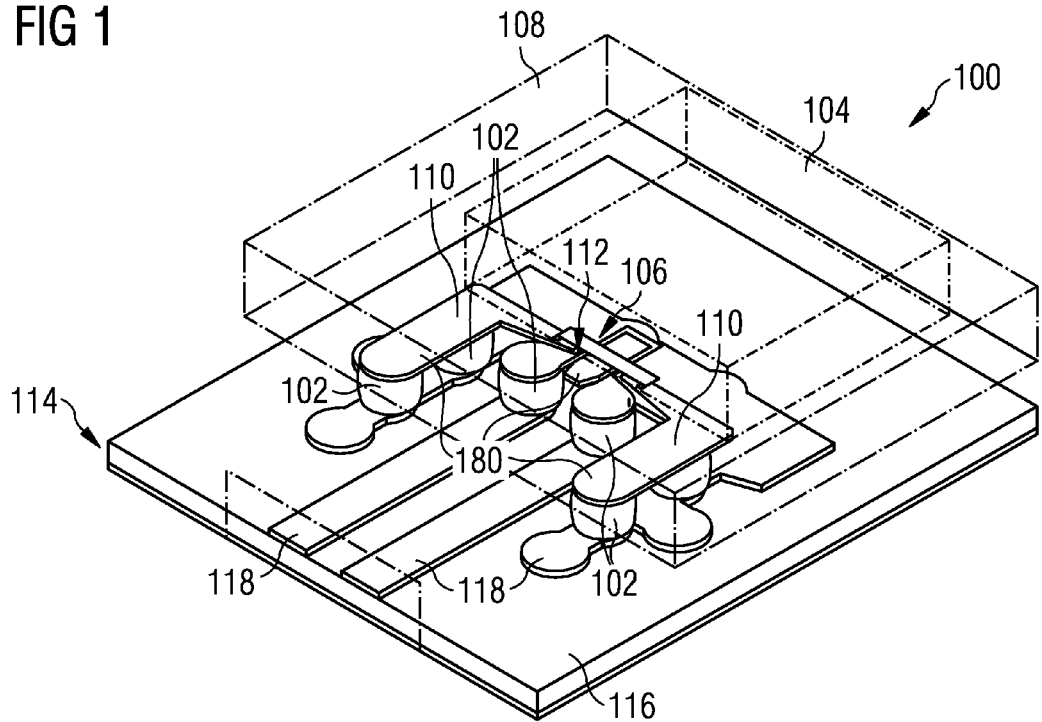
FIG. 1 shows a three-dimensional view of an electronic device according to an exemplary embodiment with a low loss differential signal transition.

The illustration in the drawing is schematically and not to scale.

Before exemplary embodiments will be described in more detail referring to the figures, some general considerations will be summarized based on which exemplary embodiments have been developed.

An exemplary embodiment relates to the design and optimization of radio frequency chip-package-board interfaces in wafer level package. Exemplary embodiments relate to layout techniques and design approaches for a redistribution layer (RDL) in an embedded Wafer Level Ball Grid Array (eWLB) packages to achieve and to realize and to meet the following issues:

a) Loss reduction of radio frequency chip-package and chip-package-board transitions, b) Impedance matching of radio frequency chip-package and chip-package-board transitions, c) chip-package and chip-package-board transitions of custom frequency characteristics (for example low-, high-, or bandpass filters), d) ESD protection in chip-package and chip-package-board transitions.

Conventionally, issues 1a) to 1c) are solved by realizing external impedance matching structures on board, i.e. on a substrate such as a printed circuit board being connected to a packaged semiconductor chip. This is difficult, because the layout of the board is often done by the customer and the design of external matching structures requires a detailed knowledge of the package and chip layout. This detailed chip and layout information is in most cases confidential and thus not available for the customers. Moreover, the design of such external impedance matching structures requires know-how and considerable effort form the customers. Thus, it is advantageous to deliver packages that do not need external matching.

Conventionally, issue 1d) is solved by realizing a dedicated structure on chip. The disadvantage of this solution is high loss introduced by these structures.

In contrast to such conventional approaches, an exemplary embodiment uses the RDL of the eWLB to create a required frequency performance and behavior of the chip-package and chip-package-board interfaces. Exemplary embodiments realize in the RDL components such as short-circuited stubs, open-circuited stubs, short high-impedance lines, short low impedance lines, slot lines, and wave effects are used to obtain the required HF performance. With such RDL layout modifications, it is possible to reduce the losses and realize broadband impedance matching of the HF transitions. Therefore, a corresponding compensation on board may become dispensable. Furthermore, exemplary embodiments create filter behavior (for example low-, high-, or bandpass filters) and provide ESD protection without additional effort with respect to costs, material and amount of space. Exemplary embodiments can be realized by using one RDL layer or more RDL layers.

One gist according to an exemplary embodiment is to use one or more RDL of the eWLB by considering the ball discontinuity to achieve at least one of goals 1a) to 1d).

FIG. 1 shows a three-dimensional view of an electronic device 100 according to an exemplary embodiment with a low loss differential signal transition performance.

The electronic device 100, which is configured as an embedded Wafer Level Ball Grid Array package, comprises a plurality of interconnects 102 embodied as solder balls for providing an electrically conductive connection between a packaged semiconductor chip 104 and a substrate 114 such as a printed circuit board.

The semiconductor chip 104 is configured for performing a radio frequency application and has for this purpose at least one integrated circuit component (not shown) integrated therein. The semiconductor chip 104 also has plurality of electric chip pads 106 which electrically connect the integrated circuit components with an exterior of the semiconductor chip 104.

An encapsulant structure 108 is made of a plastic material which packages part of the semiconductor chip 104 and provides both a mechanical protection as well as a contribution to heat dissipation of heat generated during operation of the electronic device 100.

An electrically conductive redistribution layer 110 is embedded in a dielectric matrix (not shown in FIG. 1) and is arranged between the interconnects 102 and the chip pads 106. The redistribution layer 110 is formed as one or more patterned electrically conductive layer(s) and therefore also electrically connects the interconnects 102 and the chip pads 106 and thereby closes the so-called interconnect gap between them. The redistribution layer 110 redistributes signals propagating between the interconnects 102 and the semiconductor chip 104. A first main surface (i.e. an upper surface) of the redistribution layer 110 is in direct contact with the chip pads 106, and an opposing second main surface (i.e. an lower surface) of the redistribution layer 110 is in direct contact with the interconnects 102.

Figure 2:
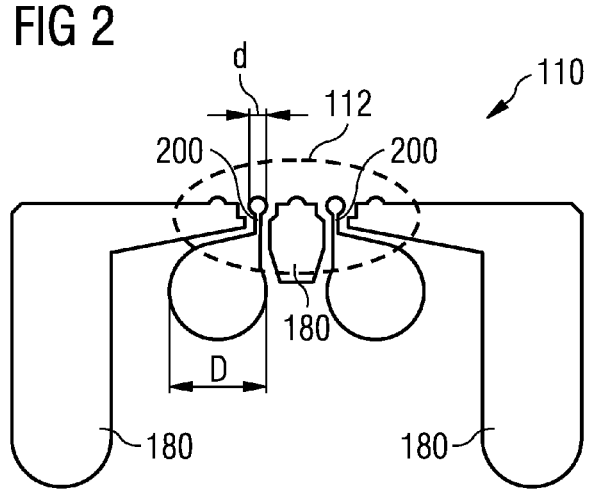
FIG. 2 shows a plan view of the redistribution layer of the electronic device according to FIG. 1.

As shown in FIG. 2 in more detail, the redistribution layer 110 comprises an adjustment structure 112 configured for adjusting radio frequency properties of an electronic transition between the semiconductor chip 104 and its periphery. The adjustment structure 112 forms part of the patterned layer of electrically conductive material constituting the redistribution layer 110. Particularly the portion of the redistribution layer 110 next to the chip pads 106 strongly contributes to the radio frequency properties of the electronic device 100 so that particularly this portion is adjusted to meet predefined radio frequency properties. The mentioned periphery is here constituted by the substrate 114 embodied as a printed circuit board and being formed by an electrically insulating carrier 116 having an electrically conductive wiring 118 patterned thereon and made of copper material. The adjustment structure 112 is here configured for matching impedance of this transition and for loss reduction at this transition.

As shown in FIG. 2 in more detail, the redistribution layer 110 additionally comprises electrically grounded sections 180.

FIG. 2 shows a plan view of the redistribution layer 110 of the electronic device 100 according to FIG. 1. The redistribution layer 110 comprises two substantially Q-shaped signal-carrying connection sections 200 (here carrying differential signals; for a single ended embodiment, a single connection section 200 may be sufficient) substantially tapering along a respective path from a respective one of the interconnects 102 (see thick portion "D" which may have a size of 320 µm) to a respective one of the electric chip pads 106 (see thin portion "d" which may have a size of 60 µm). Between a connection portion (see "D") for connection to an interconnect 102 and a connection portion (see "d") for connection to a chip pad 106, the connection section 200 comprises a narrowed signal transport line along which a radio frequency signal propagates during operation.

The electrically grounded sections 180 comprise two symmetric exterior substantially L-shaped sections, and one central substantially rectangular shaped section. Each of the two substantially Q-shaped connection sections 200 is arranged between a respective one of the substantially L-shaped sections and the central ground section of the electrically grounded sections 180. The two symmetric exterior substantially L-shaped sections, the one central substantially rectangular shaped section, and the connection sections 200 are galvanically separated from one another.

Still referring to FIG. 2, a pitch or contact dimension "d" of the chip pads 106 is in the range between 20 µm and 200 µm, for instance 100 µm. In contrast to this, a pitch or contact dimension "D" of the interconnects 102 is in the range between 300 µm and 1000 µm, for instance 500 µm. The redistribution layer 110 closes the so-called interconnect gap between the small pitch of the chip pads 106 and the larger pitch of the interconnects 102. For comparison, the thickness of the patterned electrically conductive layer forming the redistribution layer 110 may be in a range between 1 µm and 10 µm, for instance 7 µm. This patterned electrically conductive layer may be embedded in a dielectric layer (which may have two sub-layers, for instance made of organic material) having a thickness in a range between 10 µm and 50 µm, for instance 20 µm.

The adjustment structure 112 of FIG. 2 is configured to locally confine an electric field so that it cannot enter to a significant extent into the semiconductor chip 104. Additionally, the signal path along the connection sections 200 is short and thin (particularly thinner than the contacts "d" for the chip pads 106). It has turned out that the shown geometry provides for an impedance matching and a low loss transition as a result of the small central space width and line width of the connection sections 200.

Figure 3:
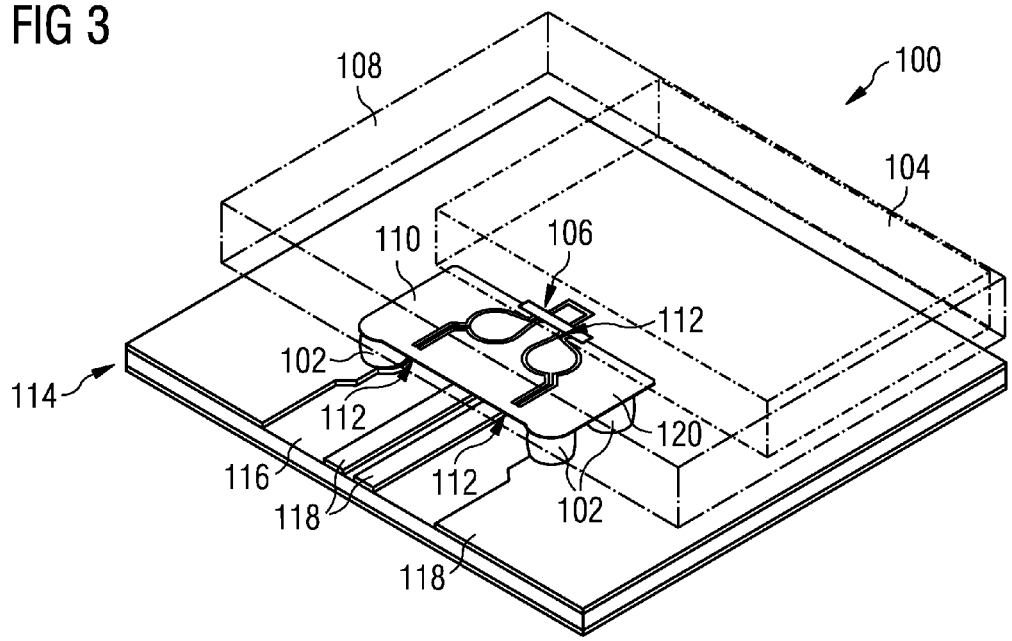
FIG. 3 shows a three-dimensional view of an electronic device according to another exemplary embodiment with a bandpass at about 40 GHz, a differential signal architecture, and an ESD protection.
Figure 4:
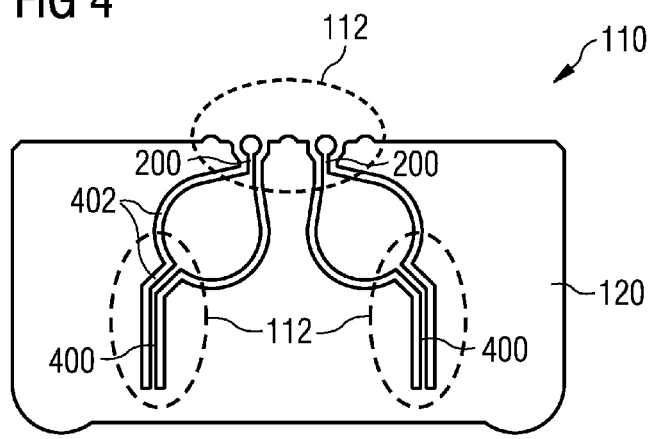
FIG. 4 shows a plan view of the redistribution layer of the electronic device according to FIG. 3.

FIG. 3 shows a three-dimensional view of an electronic device 100 according to another exemplary embodiment with a bandpass at about 40 GHz, a differential signal, and an ESD protection. FIG. 4 shows a plan view of the redistribution layer 110 of the electronic device 100 according to FIG. 3.

The redistribution layer 110 of the electronic device 100 according to FIG. 3 and FIG. 4 comprises an electrostatic discharge protection structure 120 configured for protecting the electronic device 100 against electrostatic discharge. The electrostatic discharge protection structure 120 forms part of the patterned layer of electrically conductive material constituting the redistribution layer 110. The electrostatic discharge protection structure 120 comprises a grounded section (i.e. connected to an electric ground potential) of the redistribution layer 110 and is radio frequency decoupled from a signal-carrying section (see reference numeral 200 in FIG. 2) of the redistribution layer 110, which signal-carrying section provides an electric coupling between the interconnects 102 and the electric chip pads 106. The ground section forming part of the electrostatic discharge protection structure 120 is coupled to the signal carrying section in the shown embodiment. In FIG. 4, the ground section structure assumes more than 80% of the area of the redistribution layer 110 and is galvanically coupled to two connection sections 200 carrying the actual radio frequency signals by two spatially constricted, locally narrowed stubs (see strip-like extensions 400 of the two connection sections 200) which electrically decouple the ground section from the connection sections 200 for radio frequency signals at an operation frequency of the electronic device 100 and therefore contribute to the electrostatic discharge protection in cooperation with the electrostatic discharge protection structure 120. This galvanically coupling represents the ESD protection. For example, if a harmful high voltage is existing on the PCB on a signal line, then this high voltage does not harm the semiconductor chip 104, because the high voltage is short circuited due to this galvanically coupling of the signal-carrying connection sections 200 and ground sections. This short circuit is radio frequency decoupled at the operating frequency due to resonance effects. The connection sections 200 are substantially Q-shaped, as in FIG. 2. The redistribution layer 110 is here formed as a continuous layer with recesses 402 to thereby define the two symmetric connection sections 200 being partially surrounded by the ground section. The recesses 402 also define the strip-like extensions 400 forming the short-circuited stubs and bridging the connection sections 200 with the ground section. The strip-like extensions 400, together with the interconnects 102, form an electronic LC-member. Each strip-like extension 400 constituting a short circuited stub represents both, an ESD protection and an electromagnetic matching. For the electromagnetic matching, the whole layout has an impact.

The embodiment of FIG. 3 and FIG. 4 function as a bandpass at about 40 GHz, and provides an ESD protection as a result of the design of the connection sections 200 and the short-circuited stubs.

Figure 5:
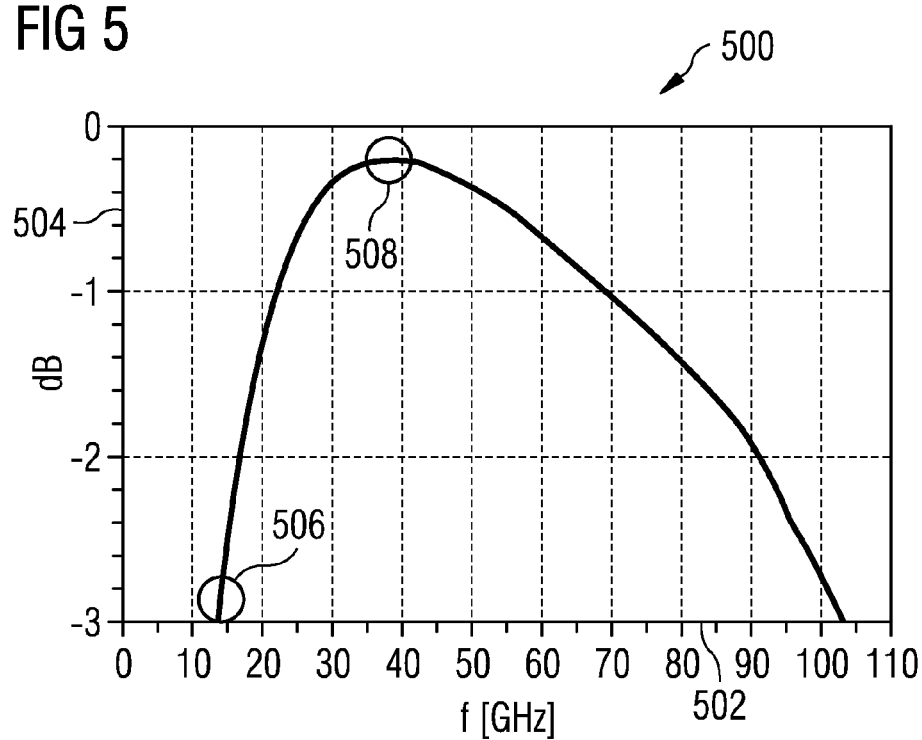
FIG. 5 shows a diagram illustrating insertion loss in dependence of an operation frequency for the electronic device according to FIG. 3.

FIG. 5 shows a diagram 500 illustrating insertion loss in dependence of an operation frequency for the electronic device 100 according to FIG. 3. The diagram 500 has an abscissa 502 along which a frequency is plotted. Along an ordinate 504, the insertion loss is plotted. As can be taken from reference numeral 506, a high loss is achieved that certain low frequencies. As can be taken from reference numeral 508, a very low loss is obtained at medium frequencies around 40 GHz (which are consequently highly suitable as operation frequency of the electronic device 100). The characteristic slope of the diagram in FIG. 5 also shows that a frequency filter function is obtained as well by the electronic device 100 according to FIG. 3.

Figure 6:
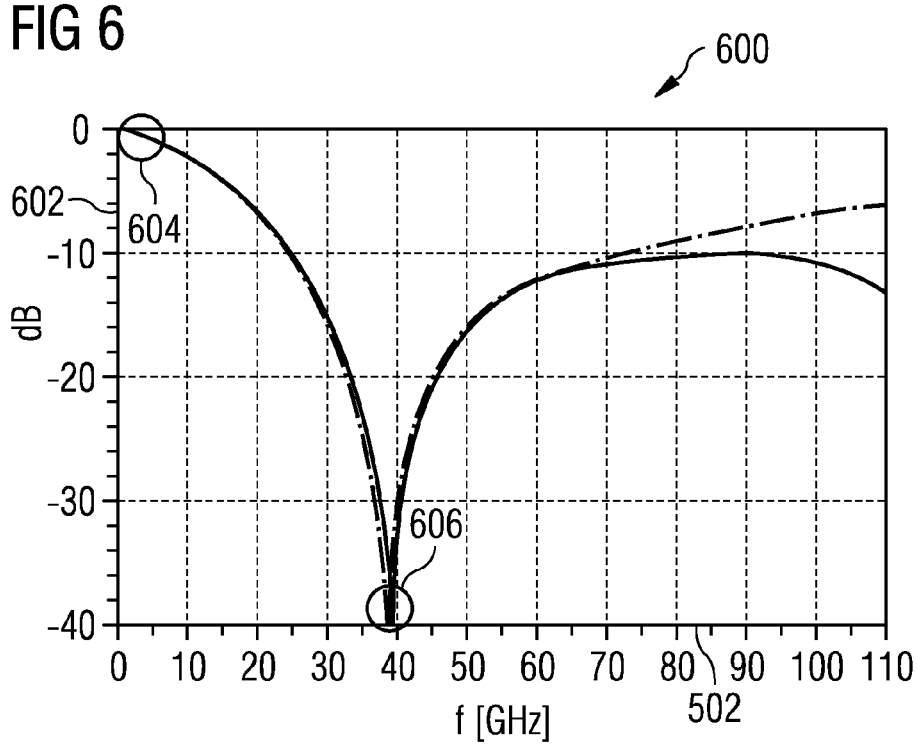
FIG. 6 shows a diagram illustrating return loss in dependence of an operation frequency for the electronic device according to FIG. 3.

FIG. 6 shows a diagram 600 illustrating return loss (i.e. a loss as a result of signal reflections at a transition) in dependence of an operation frequency for the electronic device 100 according to FIG. 3. The diagram 600 has an abscissa 502 along which a frequency is plotted. Along an ordinate 602, the return loss is plotted. Reference numeral 604 shows that short-circuiting occurs at very small frequencies. Reference numeral 606 shows that basically no reflections occur at medium frequencies around 40 GHz.

FIG. 7 shows a plan view of a redistribution layer 110 of an electronic device according to another exemplary embodiment with a bandpass filter function at about 60 GHz, a differential signal architecture, and an ESD protection.

The embodiment of FIG. 7 is very similar to the embodiment of FIG. 4, but has a different length of the short-circuited stubs defined by the strip-like extensions 400. Hence, by adjusting the length of the short-circuited stubs, a frequency adjustment may be performed.

Figure 9:
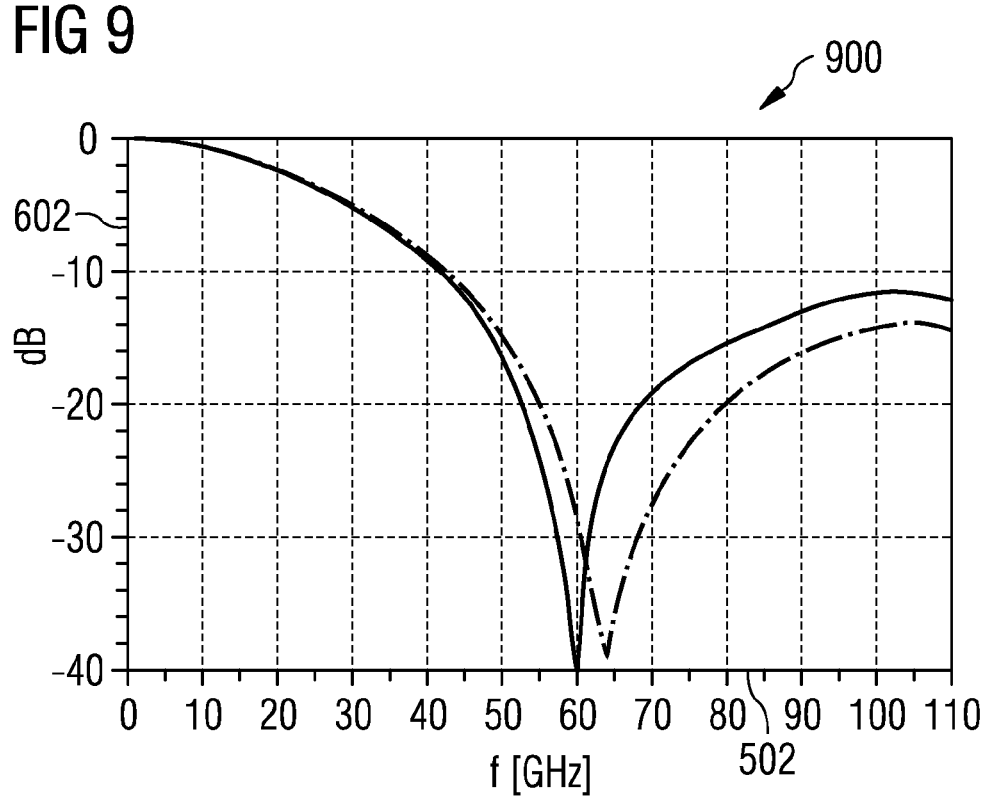
FIG. 9 shows a diagram illustrating return loss in dependence of an operation frequency for the electronic device according to FIG. 7.

FIG. 8 shows a diagram 800 illustrating insertion loss in dependence of an operation frequency for the electronic device according to FIG. 7. FIG. 9 shows a diagram 900 illustrating return loss in dependence of an operation frequency for the electronic device according to FIG. 7. Diagram 800 corresponds to diagram 500, and diagram 900 corresponds to diagram 600. It can be seen by a comparison of diagrams 500, 600 with diagrams 800, 900 that the mere adaptation of the length of the short-circuited stubs changes the optimum operation frequency and the loss characteristic.

Figure 10:
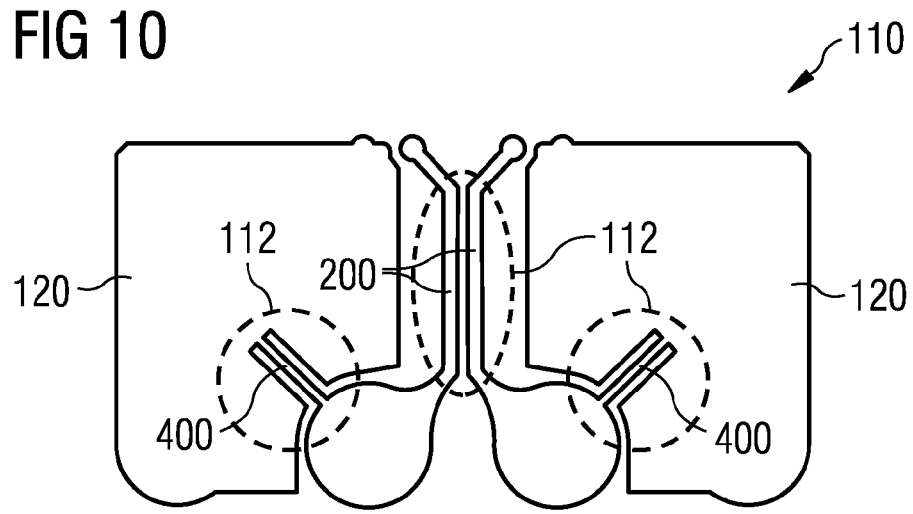
FIG. 10 shows a plan view of a redistribution layer of an electronic device according to another exemplary embodiment with a bandpass at about 60 GHz, a differential signal, a broadband realization, and an ESD protection.

FIG. 10 shows a plan view of a redistribution layer 110 of an electronic device according to another exemplary embodiment functioning as a bandpass at about 60 GHz, carrying a differential signal, and having a broadband realization and an ESD protection.

According to FIG. 10, the connection sections 200 are substantially cherry-shaped. In FIG. 10, the connection sections 200 are significantly longer than in the previously described embodiments. For instance, the signal carrying sections may have a length of 300 µm. By adjusting the dimensions of the connection sections 200, a defined impedance value may be obtained (for instance a $\lambda/4$-transformer function may be adjusted). The short-circuited stubs are slanted according to FIG. 10 with regard to an extension of the connection sections 200.

FIG. 11 shows a diagram 1100 illustrating insertion loss and return loss in dependence of an operation frequency for the electronic device according to FIG. 10. The diagram 1100 includes a comparable information as diagrams 500 and 600. A curve 1102 in diagram 1100 relates to insertion loss, whereas a curve 1104 of diagram 1100 relates to return loss.

FIG. 10 and FIG. 11 show a bandpass performance at about 60 GHz, a broadband realization, and an ESD protection.

Although FIG. 1 to FIG. 11 are embodied with a differential signal architecture, each of these embodiments can alternatively be embodied as a single ended architecture.

FIG. 12 shows a plan view of a redistribution layer 110 of an electronic device according to another exemplary embodiment with a bandpass function, a single-ended signal architecture, and an ESD protection.

A single connection section 200 is provided which is surrounded by two symmetric exterior sections 1200, 1202 forming ground sections. The connection section 200 is substantially cross shaped with an interior recess 1204. The interior recess 1204 increases the effective length of the path which the propagating signal has to travel between chip pad 106 and interconnect 102 without increasing the space requirement of the redistribution layer 110. Thus, FIG. 12 represents a bandpass, single-ended realization with ESD protection using short-circuited stubs formed by strip-like extensions 400, slot line and a quarter wave transformer design.

The layouts with a direct copper connection from the signal carrying section 200 to the ground section 120 (FIG. 4, FIG. 7, FIG. 10, FIG. 11) have an ESD protection (for signal lines), because there are the harmful high voltages, caused from ESD effects, short circuited. And this short circuit is in these layouts radio frequency decoupled due to resonance effects. High voltage is short circuited due to this galvanic connection.

The skilled person will appreciate that, by using the above described components and effects, numerous variations are possible, also by using an additional redistribution layer, to achieve an electrical performance required or desired for a certain radio frequency application.

FIG. 13 shows a cross-sectional view of an electronic device 100 according to an exemplary embodiment with a radio frequency adjustment, formed within a redistribution layer 110, between a semiconductor chip 102 and an antenna 1300 integrated in the redistribution layer 110. Hence, the redistribution layer 110 comprises a sub-structure in form of an appropriately patterned electrically conductive portion which is configured to fulfill an antenna performance, i.e. the emission and/or reception of wireless signals.

The electronic device 100 according to FIG. 13 therefore comprises the antenna 1300 which is integrated in the redistribution layer 110. In the embodiment of FIG. 13, an adjustment structure integrated in the redistribution layer 110 as well is configured for adjusting radio frequency properties of a transition between the semiconductor chip 104 and the antenna 1300. In other words, the above-mentioned periphery of the semiconductor chip 104 to be matched with regard to the semiconductor chip 104, is here constituted by the antenna 1300. More generally, it is also possible to provide an adjustment structure for adjusting a transition between a semiconductor chip 104 and a radio frequency component (such as an antenna, an inductor, a capacitance, or any other electronic radio frequency member) integrated in the redistribution layer 110.

FIG. 14 shows a cross-sectional view of an electronic device 100 according to an exemplary embodiment with a radio frequency adjustment, formed within a redistribution layer 110, between two semiconductor chips 104, 1400 packaged within the same encapsulating structure 108.

The electronic device 100 therefore comprises two commonly packaged semiconductor chips 104, 1400. Also further semiconductor chip 1400 comprises further electric chip pads 1402. The encapsulant structure 108 packages additionally also the further semiconductor chip 1400. The redistribution layer 110 is electrically coupled additionally with the further chip pads 1402. An adjustment structure is foreseen as part of the redistribution layer 110 and is configured for adjusting radio frequency properties of a transition between the semiconductor chip 104 and the further semiconductor chip 1400. In other words, the above-mentioned periphery of the semiconductor chip 104 to be matched with regard to the semiconductor chip 104, is here constituted by the further semiconductor chip 1400. More generally, it is also possible to provide an adjustment structure for adjusting a transition between a semiconductor chip 104 and any other electronic member being packaged within the same encapsulating structure 108 as the semiconductor chip 104 and being electrically connected to the semiconductor chip 104.

FIG. 15 shows a cross-sectional view of an electronic device 100 according to an exemplary embodiment with a radio frequency adjustment formed within two redistribution layers 110, 1500.

The electronic device 100 hence comprises further redistribution layer 1500 arranged between and electrically coupled with the interconnects 102 and the chip pads 106. The redistribution layer 110 is sandwiched between the encapsulating structure 108 including the semiconductor chip 104 on the one hand and the further redistribution layer 1500 on the other hand. Using two or more redistribution layers 110, 1500, even more sophisticated adjustment tasks can be implemented in the redistribution layers 110, 1500.

FIG. 16 to FIG. 21 show cross-sectional views of different structures obtained during carrying out a method of manufacturing an electronic arrangement 2000 and of subsequently manufacturing multiple electronic devices 100 from this electronic arrangement 2000 according to an exemplary embodiment.

Figure 16:
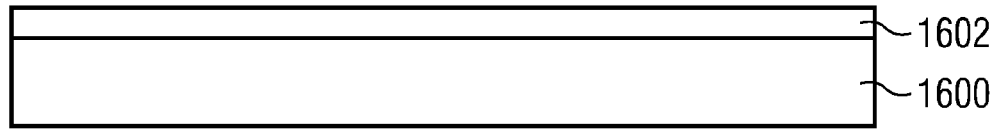
FIG. 16 to FIG. 21 show cross-sectional views of different structures obtained during carrying out a method of manufacturing an electronic arrangement and of subsequently manufacturing multiple electronic devices from this electronic arrangement according to an exemplary embodiment.

FIG. 16 shows a metal carrier 1600 and a plastic sheet 1602 placed on the metal carrier 1600.

Figure 17:
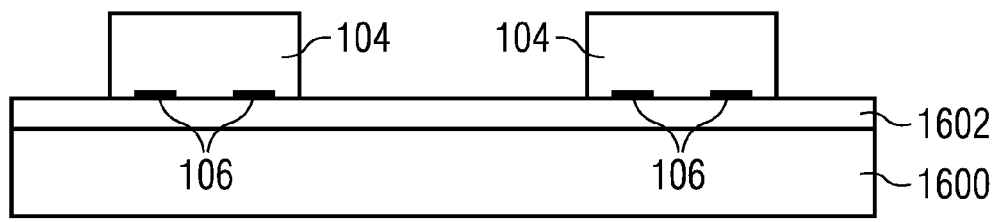

In order to obtain the structure shown in FIG. 17, a plurality of semiconductor chips 104 having chip pads 106 are placed on the plastic sheet 1602.

Figure 18:
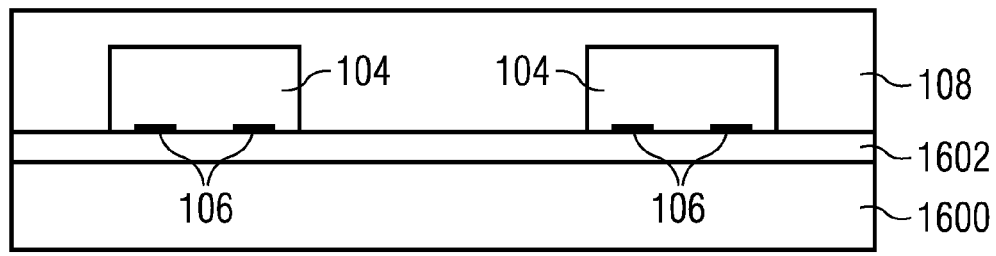

In order to obtain the structure shown in FIG. 18, the semiconductor chips 104 with chip pads 106 are encapsulated (for instance overmolded) by a common encapsulating structure 108 of liquid plastic material which is subsequently hardened. As a result, an artificial wafer of the semiconductor chips 104 and the common encapsulating structure 108 is obtained.

Figure 19:
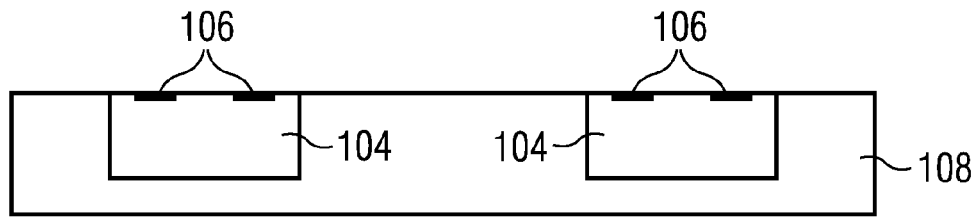

In order to obtain the structure shown in FIG. 19, the metal carrier 1600 and the plastic sheet 1602 are removed, and the resulting structure is turned around by 180°.

Figure 20:
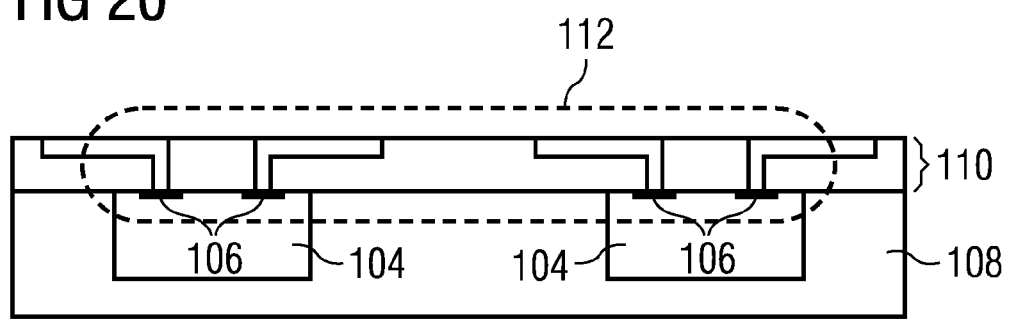

In order to obtain the structure shown in FIG. 20, a redistribution layer 110 is formed by depositing and patterning dielectric layers and metallic structures. During this procedure, an adjustment structure and an electrostatic discharge protection structure are integrated within the redistribution layer 110 and are configured to fulfil their corresponding tasks, as described above.

Figure 21:
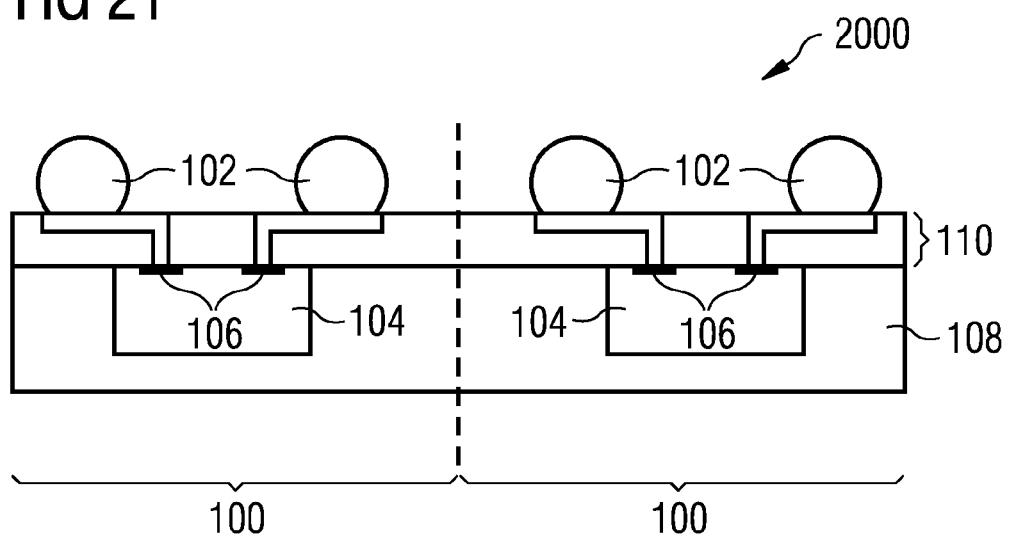

In order to obtain the electronic arrangement 2000 shown in FIG. 21, interconnects 102 in form of solder balls are attached to exposed metal structures of the redistribution layer 110. Thus, the electronic arrangement 2000 is obtained.

By singularizing individual electronic devices 100 from the electronic arrangement 2000 (for instance by sawing and/or etching), the process is finished.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. An electronic device, comprising:
    at least one interconnect;
    a semiconductor chip comprising at least one electric chip pad;
    an encapsulant structure packaging at least a part of the semiconductor chip; and
    an electrically conductive redistribution layer arranged between and electrically coupled with the at least one interconnect and the at least one chip pad;
    wherein the redistribution layer comprises at least one adjustment structure configured for adjusting radio frequency properties of a transition between the semiconductor chip and its periphery.

2. The electronic device according to claim 1, wherein the at least one adjustment structure is configured for matching impedance of the transition.

3. The electronic device according to claim 1, wherein the at least one adjustment structure is configured for loss reduction at the transition.

4. The electronic device according to claim 1, wherein the at least one adjustment structure is configured as a frequency filter at the transition.

5. The electronic device according to claim 1,
    comprising a substrate which comprises an electrically insulating carrier and an electrically conductive wiring structure on and/or in the carrier, wherein the wiring structure is electrically coupled to the at least one interconnect;

wherein at least a part of the at least one adjustment structure is configured for adjusting radio frequency properties of a transition between the semiconductor chip and the substrate.

6. The electronic device according to claim 1, comprising at least one further semiconductor chip comprising at least one further electric chip pad, wherein the encapsulant structure packages additionally at least a part of the further semiconductor chip, and wherein the redistribution layer is electrically coupled additionally with the at least one further chip pad;

wherein at least a part of the at least one adjustment structure is configured for adjusting radio frequency properties of a transition between the semiconductor chip and the at least one further semiconductor chip.

7. The electronic device according to claim 1, comprising an antenna, in particular integrated in the redistribution layer;

wherein at least a part of the at least one adjustment structure is configured for adjusting radio frequency properties of a transition between the semiconductor chip and the antenna.

8. The electronic device according to claim 1, wherein the redistribution layer comprises at least one electrostatic discharge protection structure configured for protecting the electronic device against electrostatic discharge.

9. The electronic device according to claim 8, wherein the at least one electrostatic discharge protection structure comprises a ground section which is decoupled for radio frequency signals from at least one other section of the redistribution layer, which at least one other section provides an electric coupling between the at least one interconnect and the at least one electric chip pad.

10. The electronic device according to claim 9, wherein the ground section is galvanically coupled to the at least one other section to thereby provide the electrostatic discharge protection.

11. The electronic device according to claim 9, wherein the ground section is galvanically coupled to the at least one other section by a constricted stub section which electrically decouples the ground section from the at least one other section for radio frequency signals at an operation frequency of the electronic device.

12. The electronic device according to claim 1, wherein the redistribution layer comprises at least one connection section tapering along a respective path from a respective one of the at least one interconnect to a respective one of the at least one electric chip pad.

13. The electronic device according to claim 1, wherein the semiconductor chip is configured for operating at a frequency of at least 10 GHz, in particular in a frequency range between 10 GHz and 140 GHz.

14. The electronic device according to claim 1, wherein the redistribution layer is shaped substantially as shown in any of FIG. 2, FIG. 4, FIG. 7, FIG. 10, or FIG. 12.

15. An electronic device, comprising:
   at least one interconnect;
   a semiconductor chip comprising at least one electric chip pad;
   an encapsulant structure packaging at least a part of the semiconductor chip; and
   an electrically conductive redistribution layer arranged between and electrically coupled with the at least one interconnect and the at least one chip pad;
   wherein the redistribution layer comprises at least one electrostatic discharge protection structure configured for protecting the electronic device against electrostatic discharge.

16. A method of manufacturing an electronic arrangement, the method comprising:
   providing a plurality of singularized semiconductor chips each comprising at least one electric chip pad;
   packaging each of the plurality of semiconductor chips at least partially by a common encapsulant structure;
   forming an electrically conductive redistribution layer electrically coupled with the chip pads;
   integrating at least one adjustment structure within the redistribution layer;
   configuring the at least one adjustment structure for adjusting radio frequency properties of a transition between at least one of the semiconductor chips and a periphery thereof;
   forming an array of interconnects electrically connected with the redistribution layer.

17. The method according to claim 16, wherein the method comprises trimming the redistribution layer so as to create a target radio frequency behaviour of the electronic arrangement or part thereof.

18. The method according to claim 16, wherein the method comprises separating the electronic arrangement into a plurality of individual electronic devices each comprising at least one of the semiconductor chips with at least one corresponding electric chip pad, a portion of the encapsulant structure packaging the at least one semiconductor chip at least partially, a portion of the redistribution layer and at least one of the interconnects.

19. The method according to claim 18, wherein the method comprises mounting at least one of the electronic devices onto a substrate which comprises an electrically insulating carrier and an electrically conductive wiring structure on and/or in the carrier, wherein the wiring structure is electrically coupled to at least one of the interconnects assigned to the respective at least one electronic device.

20. The method according to claim 19, wherein the mounting is performed without additionally adjusting radio frequency properties of a transition between the at least one of the semiconductor chips and the substrate.

* * * * *